(12) United States Patent
Ang et al.

(10) Patent No.: US 9,373,603 B2
(45) Date of Patent: Jun. 21, 2016

(54) REFLOW PROCESS AND TOOL

(71) Applicant: Taiwan Semiconductor Manufacturing Company, Ltd., Hsin-Chu (TW)

(72) Inventors: Ai-Tee Ang, Hsin-Chu (TW); Hsiu-Jen Lin, Zhubei (TW); Cheng-Ting Chen, Taichung (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/194,057

(22) Filed: Feb. 28, 2014

(65) Prior Publication Data

US 2015/0249062 A1 Sep. 3, 2015

(51) Int. Cl.
*H01L 21/50* (2006.01)
*H01L 23/00* (2006.01)
(Continued)

(52) U.S. Cl.
CPC .............. *H01L 24/75* (2013.01); *B23K 1/0016* (2013.01); *B23K 1/203* (2013.01); *B23K 3/04* (2013.01); *B23K 3/082* (2013.01); *H01L 24/81* (2013.01); *H01L 25/105* (2013.01); *H01L 25/50* (2013.01); *H01L 24/13* (2013.01); *H01L 24/16* (2013.01); *H01L 24/20* (2013.01); *H01L 24/29* (2013.01); *H01L 24/32* (2013.01); *H01L 2224/12105* (2013.01); *H01L 2224/131* (2013.01); *H01L 2224/16227* (2013.01); *H01L 2224/2101* (2013.01); *H01L 2224/2919* (2013.01); *H01L 2224/32225* (2013.01); *H01L 2224/48227* (2013.01); *H01L 2224/73265* (2013.01); *H01L 2224/755* (2013.01); *H01L 2224/759* (2013.01); *H01L 2224/7565* (2013.01); *H01L 2224/7598* (2013.01); *H01L 2224/75101* (2013.01); *H01L 2224/75251* (2013.01); *H01L 2224/75252* (2013.01); *H01L 2224/75283* (2013.01); *H01L 2224/812* (2013.01); *H01L 2224/8121* (2013.01); *H01L 2224/8123* (2013.01); *H01L 2224/81065* (2013.01); *H01L 2224/81075* (2013.01); *H01L 2224/81191* (2013.01);
(Continued)

(58) Field of Classification Search
None
See application file for complete search history.

(56) References Cited

U.S. PATENT DOCUMENTS 5,451,274 A * 9/1995 Gupta .......................... 148/512
6,269,998 B1 * 8/2001 Katayama et al. ............ 228/102

(Continued)

OTHER PUBLICATIONS

Tong et al., "Wafer Bump Reflow" Solid State Technology, http://electroiq.com/blog/2003/07/wafer-bump-reflow/, 7 pages.

*Primary Examiner* — Duy T Nguyen
*Assistant Examiner* — Bo Bin Jang
(74) *Attorney, Agent, or Firm* — Slater Matsil, LLP

(57) ABSTRACT

Reflow processes and apparatuses are disclosed. A process includes enclosing a package workpiece in an enclosed environment of a chamber of a reflow tool; causing an oxygen content of the enclosed environment of the chamber to be less than 40 ppm; and performing a reflow process in the enclosed environment of the chamber while the oxygen content is less than 40 ppm. An apparatus includes a reflow chamber, a door to the reflow chamber, an energy source in the reflow chamber, and gas supply equipment coupled to the chamber. The door is operable to enclose an environment in the reflow chamber. The energy source is operable to increase a temperature in the environment in the reflow chamber. The gas supply equipment is operable to provide a gas to the reflow chamber.

18 Claims, 6 Drawing Sheets

(51) Int. Cl.
*B23K 1/00* (2006.01)
*B23K 1/20* (2006.01)
*B23K 3/04* (2006.01)
*B23K 3/08* (2006.01)
*H01L 25/10* (2006.01)
*H01L 25/00* (2006.01)

(52) U.S. Cl.
CPC .. *H01L 2224/81815* (2013.01); *H01L 2224/95* (2013.01); *H01L 2924/01007* (2013.01); *H01L 2924/15311* (2013.01); *H01L 2924/181* (2013.01); *H01L 2924/2026* (2013.01)

(56) References Cited

U.S. PATENT DOCUMENTS

| | | | |
|---|---|---|---|
| 6,471,115 B1 * | 10/2002 | Ijuin et al. | 228/180.22 |
| 6,600,137 B1 * | 7/2003 | Nonomura et al. | 219/388 |
| 8,440,503 B1 | 5/2013 | Lin et al. | |
| 2014/0027431 A1 | 1/2014 | Cheng et al. | |

* cited by examiner

REFLOW PROCESS AND TOOL

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, as examples.

Various packages are commonly fabricated by reflowing solder to attach various components. This solder may provide for electrical connections between those components, as well as providing for a mechanical connection to secure the components together.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
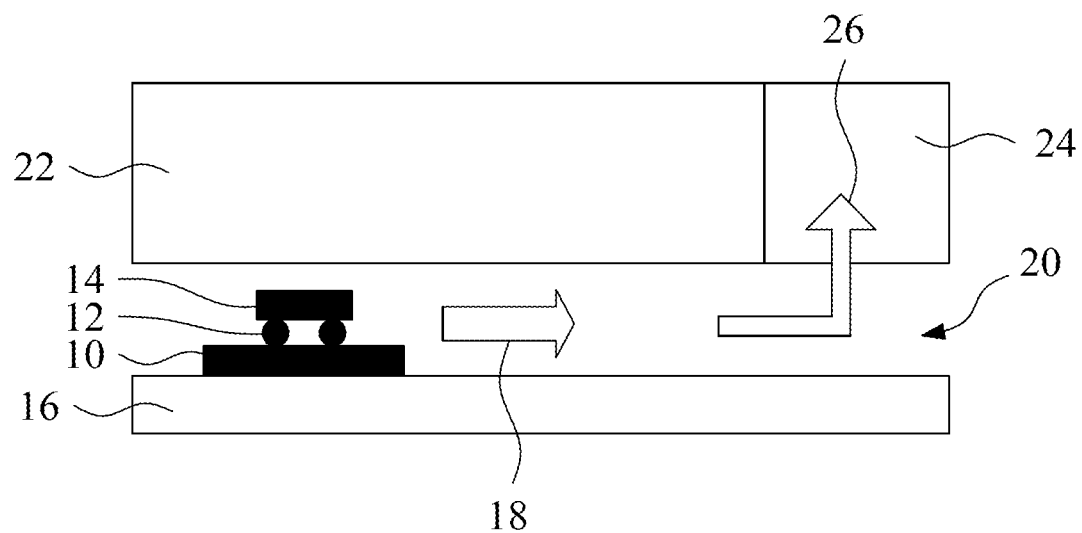
FIGS. 1 through 3 are a simplified reflow tool and process according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, process/method embodiment discussed herein may be discussed as being performed in a particular order; other process/method embodiments may be performed in any logical order.

Figure 2:
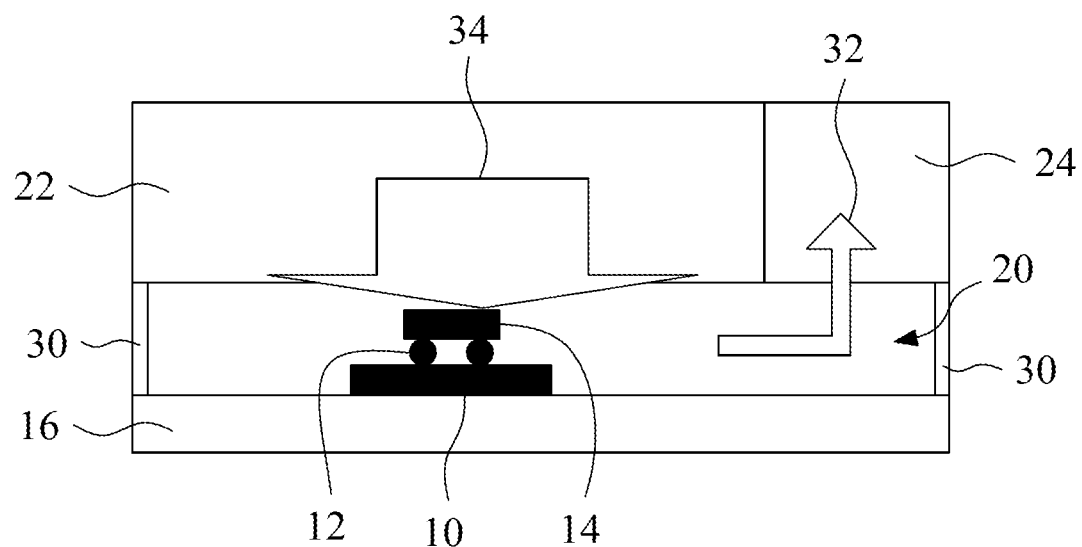
Figure 3:
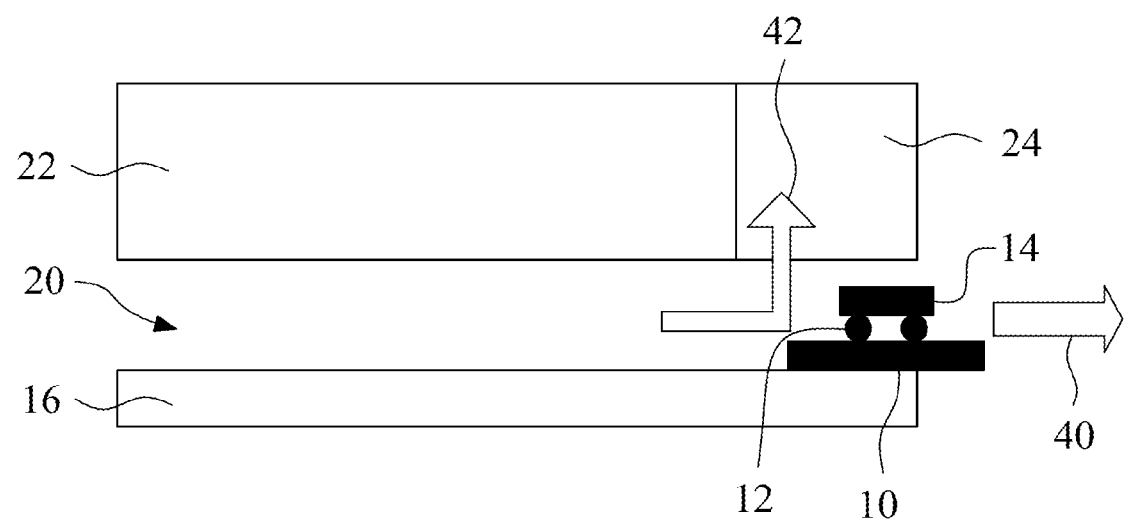
Figure 4:
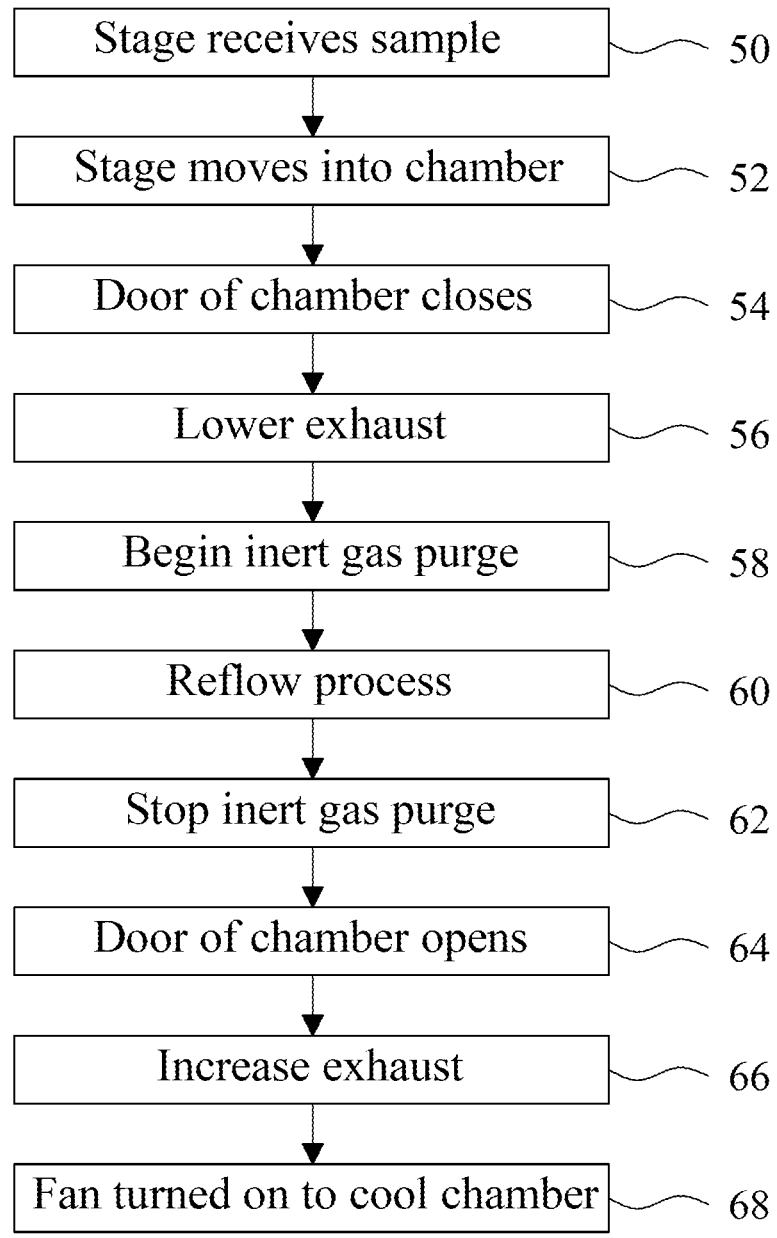
FIG. 4 is a reflow process flow chart according to an embodiment.

FIGS. 1 through 3 illustrate a simplified reflow tool and process according to an embodiment. FIG. 4 is a reflow process flow chart according to an embodiment. FIGS. 1 through 3 will be discussed in the context of the process flow illustrated in FIG. 4. A person of ordinary skill in the art will readily understand how embodiments discussed herein may be modified while remaining within the contemplated scope of embodiments.

FIG. 1 illustrates a first workpiece 10 and a second workpiece 14 that are to be coupled, mechanically and/or electrically, by a reflowable material 12. The first workpiece 10 and the second workpiece 14 may be an integrated circuit die, an interposer, an organic substrate, a printed circuit board (PCB), a die-containing package, or the like. The reflowable material 12 may be any material that is capable of being reflowed, such as solder, or more particularly, a lead-free solder. For ease of reference, the first workpiece 10, second work piece 14, and reflowable material 12 are collectively referenced as a package workpiece. Although a single package workpiece is illustrated for clarity, the reflow tool and process may accommodate multiple package workpieces simultaneously, such as in a batch process. One or more package workpieces may be processed through the reflow tool using a boat.

In FIG. 1, the package workpiece (or a boat that the package workpiece is on) is received by a stage 16 of the reflow tool (step 50 of FIG. 4), and the stage 16 with the package workpiece are moved 18 into a reflow chamber 20 of the reflow tool (step 52). The receiving of the package workpiece and the moving of the stage 16 and the package workpiece may be by automated and/or manual processes. The reflow tool further comprises an energy source 22 and an exhaust system 24. While the stage 16 and package workpiece are moving into the chamber 20, the exhaust system 24 may be operating 26 to alter and/or remove an environment in the chamber 20. Such operation 26 of the exhaust system 24 may be at, for example, a pressure greater than about 5 mm H2O.

In FIG. 2, once the stage 16 and package workpiece are in the chamber 20, a door(s) 30 of the chamber 20 is closed (step 54), at which point the operation 32 of the exhaust system 24 is decreased (step 56). The doors 30 may be automatic doors that close automatically, and in other embodiments, the doors 30 may be manually closed. The closing of the doors 30 may prevent at least some oxygen from an environment exterior to the chamber 20 from entering the chamber 20. The operation 32 of the exhaust system 24 may be reduced to, for example, a pressure less than about 5 mm H2O. An inert gas 34 is then supplied to the chamber 20 to begin a purge process (step 58). The inert gas 34 in an embodiment is nitrogen ($N_2$) gas, and in other embodiments, the inert gas 34 may be a forming gas, the like, or a combination thereof. The inert gas 34 may be supplied at a flow rate of at least about 17 $m^3$/min.

During the purge process, an oxygen ($O_2$) content in the chamber may be reduced. Once the oxygen content is reduced below a predetermined amount, a reflow process is performed (step 60). In an embodiment, the predetermined amount for the oxygen content in the chamber is 40 parts per million (ppm), although in other embodiments, differing amounts may be used. The reflow process may comprise the energy source 22 of the reflow tool applying heat and/or energy to the package workpiece to reflow the reflowable material 12. In some embodiments, the energy source 22 may comprise a radiation source, such as one or more infrared (IR) lamps that provide IR radiation to the package workpiece. In an embodiment, 10 IR lamps are used in a chamber in a tool, and each lamp is a 4.2 kW lamp. In this embodiment, the IR lamps may be on between about 4 sec and about 10 sec, such as about 6 sec. This may cause an environment in the chamber 20 to reach a temperature between about 40° C. and about 60° C., and more particularly, between about 45° C. and about 55° C., which may reflow a reflowable material 12, such as solder. In other embodiments, other energy sources may be used. Further, differing durations may be used, and differing temperatures may be used. Hence, in an embodiment, the reflow process may be carried out in a low oxygen content environment, such as an environment having less than 40 ppm of oxygen. Once the reflowable material 12 has been reflowed, the reflow process may end, such as by turning off the energy source 22, and the inert gas purge may end (step 62) by stopping the supply of the inert gas 34 to the chamber 20. The purge time may be variable or controllable, for example, depending on a specification of a reflow time and/or temperature.

In FIG. 3, once the reflow process and/or inert gas purge is completed, the doors 30 of the chamber 20 are opened (step 64). Once the doors 30 are opened, the operation 42 of the exhaust system 24 may be increased (step 66), such as to a pressure greater than about 15 mm H2O. Also after the doors 30 are opened, the package workpiece, with the reflowable material 12 being reflowed, may be moved 40 out of the chamber 20. A fan may also be turned on to cool the chamber 20 (step 68).

Figure 5:
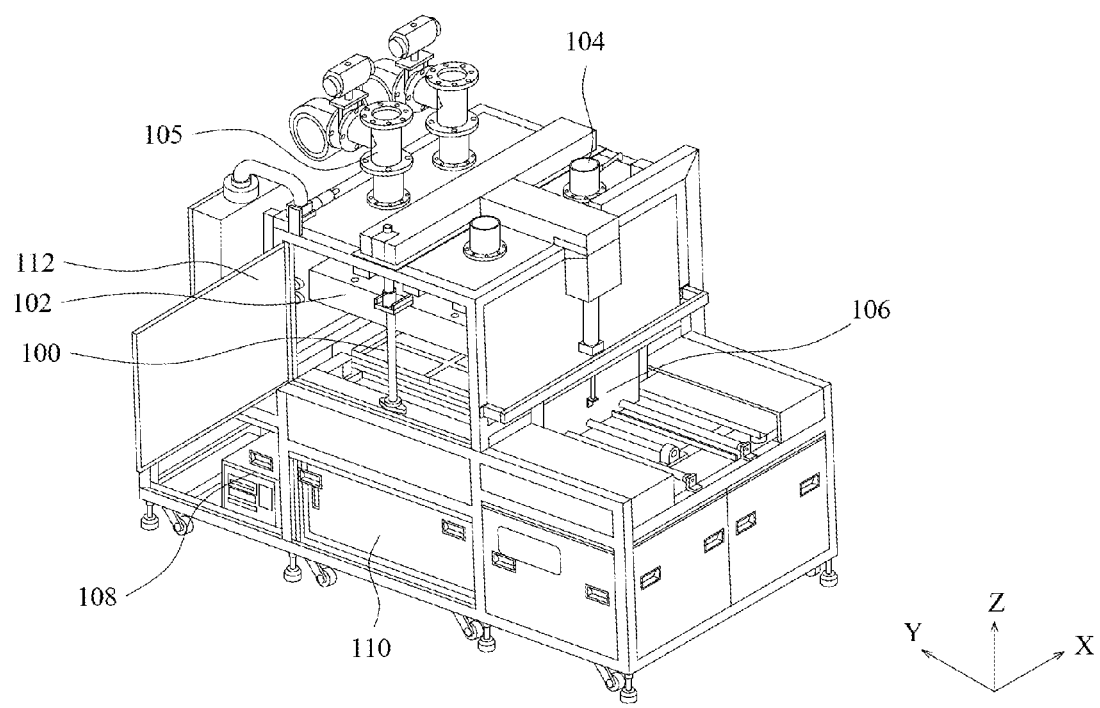
FIG. 5 is a reflow tool according to an embodiment.

FIG. 5 illustrates a reflow tool according to an embodiment. X-Y-Z axes are illustrated for ease of description of different components. A chamber panel 112 is shown removed from the chamber to illustrate components within the chamber. A person of ordinary skill in the art will understand that the chamber panel 112 will be a wall of the chamber during operation.

The reflow tool, as illustrated, comprises a stage 100 and energy source 102 in the chamber. The chamber has a door 106. The stage 100 is moveable along a track through the door 106 and in a Y-direction. An automated screw mechanism or other driving mechanism can move the stage 100 along the track. The screw mechanism includes a rotatable threaded shaft. The stage 100 is coupled to this threaded shaft. When the threaded shaft rotates in one direction around its longitudinal axis, the stage 100 moves towards and/or into the chamber, and when the threaded shaft rotates in an opposite direction around its longitudinal axis, the stage 100 moves away from and/or out of the chamber. In other embodiments, the stage 100 may be moveable by a conveyor belt around two or more rollers or pulleys. The stage 100 may be configured to be able to receive and secure one or more boats, with each boat comprising one or more package workpiece, during a reflow process. An automated pneumatic piston or other driving mechanism can move the door 106 along a track and in the Z-direction.

The energy source 102 in an embodiment comprises one or more IR lamps. In this embodiment, the chamber has 10 IR lamps, which may be located above, below, or above and below the stage 100. The IR lamps are each 4.2 kW in this embodiment. The IR lamps may be on between about 4 sec and about 10 sec, such as about 6 sec, during a reflow process, and may cause an environment in the chamber to reach a temperature between about 40° C. and about 60° C., such as between about 45° C. and about 55° C., which may cause a reflowable material, such as solder, to reflow. In other embodiments, the energy source 102 may comprise a convection heat source or any acceptable energy source.

The reflow tool comprises an exhaust system 104 coupled to the chamber. The exhaust system 104 may comprise fans. The exhaust system 104 can have a controllable operation, such that the exhaust system 104 may provide a variable or adjustable pressure. In some embodiments, the exhaust system 104 may provide less than about 5 mm H2O, greater than about 5 mm H2O, greater than about 15 mm H2O, or other pressure(s) during a given process. Gas supply equipment 105 is coupled to the chamber to supply an inert gas, such as nitrogen, forming gas, or the like, to the chamber during a purge process. The gas supply equipment 105 comprises dual blowers that may operate simultaneously to supply the inert gas. In some embodiments, the gas supply equipment 105 is controllable to provide a variable flow rate of the inert gas, and may be operable to provide a flow rate of at least about 17 m³/min, for example. The gas supply equipment 105 may provide the inert gas for a variable or controllable time according to a specification of a reflow time and/or temperature. Sensor equipment 108 is coupled to the chamber and senses an oxygen content in the environment of the chamber. In an embodiment, the sensor equipment 108 may be operable to sense when an oxygen content in the environment of the chamber is less than 40 ppm.

The reflow tool also comprises controller equipment 110. The controller equipment 110 may be a programmable logic controller (PLC) in an embodiment. In another embodiment, the controller equipment 110 may include program code stored on a storage medium, such as non-transitory memory like RAM, ROM, or the like, and a processor to execute the program code. In other embodiments, the controller equipment may be hardwired circuitry or other configurations to implement various actions, or may be any combination of a PLC, a processor executing program code, hardwired circuitry, or other configuration.

The controller equipment 110 can control the operation of various components of the reflow tool. For example, the controller equipment 110 may control actuators that control devices that move the door 106 and/or stage 100. The controller equipment 110 may control when the inert gas flow provided by the gas supply equipment is turned on and off and may control a flow rate of the inert gas. The controller equipment 110 may control when the exhaust system 104 is turned on and off and may control the pressure provided by the exhaust system 104. The controller equipment 110 may receive an indication from the sensor equipment 108 of an oxygen content in the environment in the chamber and may control when, and to what power level, the energy source 102 is turned on or off. The controller equipment 110 may implement various actions discussed with respect to FIGS. 1 through 4.

Embodiments may provide advantages. For example, some embodiments may provide for a low oxygen content environment in a chamber of a reflow tool during a reflow process. This may allow for reduced oxidation on, for example, a solder surface of a joint between substrates joined by the solder. Hence, a risk of a cold joint may be reduced, and yield may be increased. Further, by using a door to a chamber of a reflow tool, usage of an inert gas, such as nitrogen or the like, may be reduced, which may reduce costs. Also, embodiments may be compatible with formic gas processes.

Figure 6:
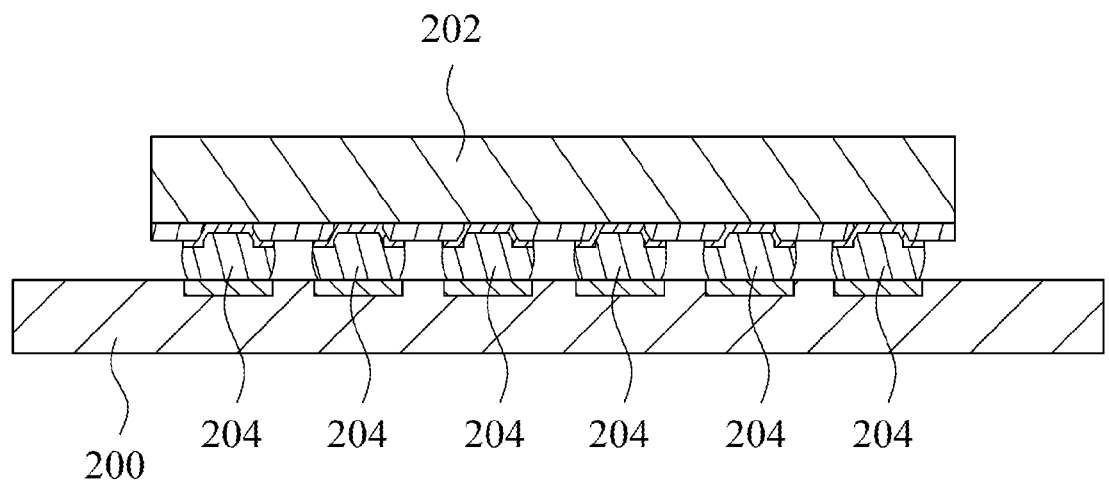
FIG. 6 illustrates a flip-chip configuration of an example workpiece to which embodiments may be applied.
Figure 7:
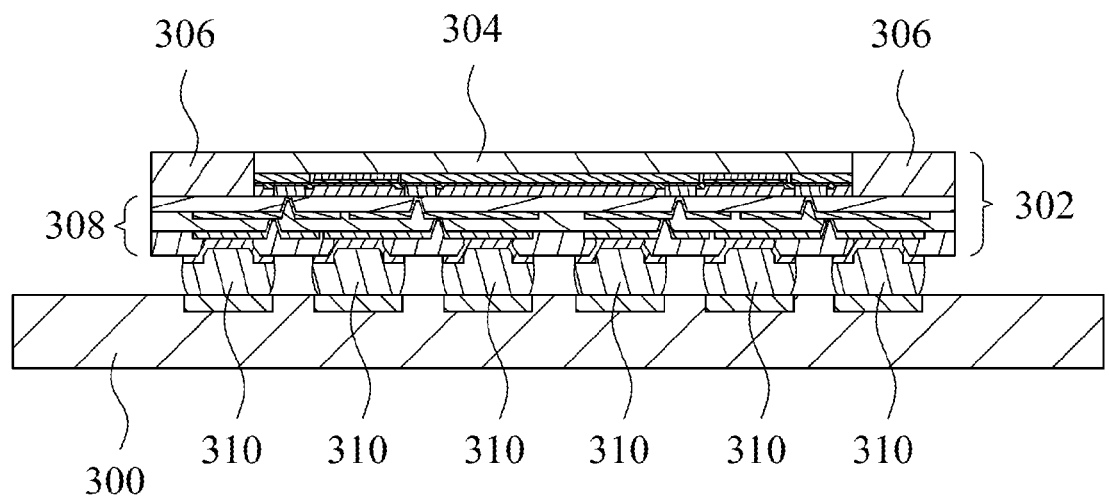
FIG. 7 is a Fan-Out Wafer Level Package (FOWLP) as an example workpiece to which embodiments may be applied.
Figure 8:
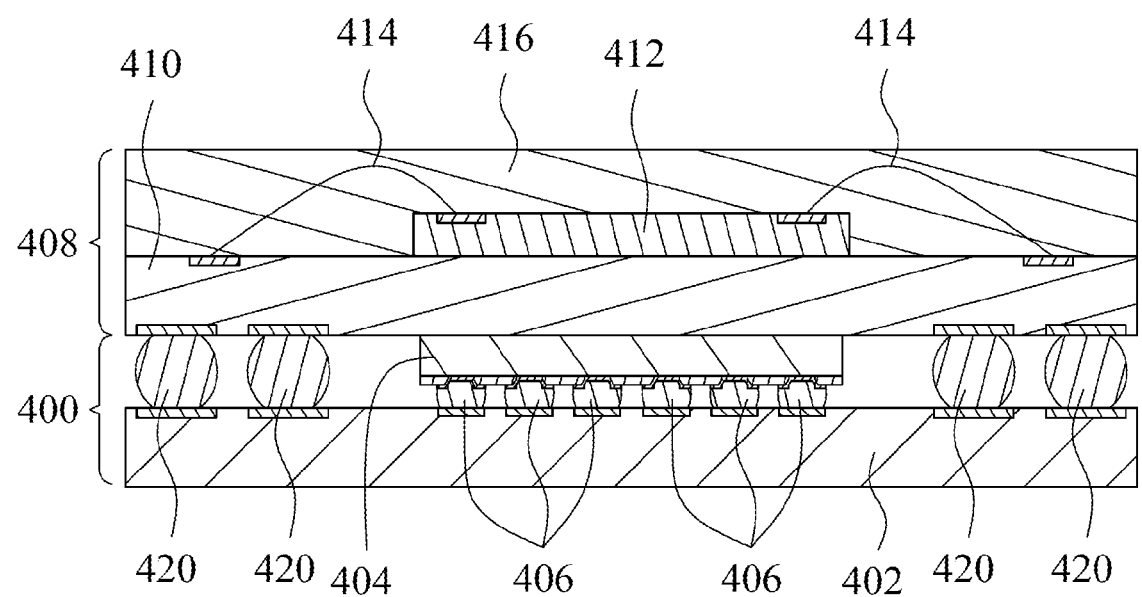
FIG. 8 is a Package-On-Package (POP) as an example workpiece to which embodiments may be applied.

FIGS. 6 through 8 illustrate various package workpieces to which various embodiments may be applied. Many other types of workpieces may be used in embodiments although not explicitly discussed herein. A person of ordinary skill in the art will readily understand different workpieces to which embodiments may be applied. These workpieces are contemplated within scopes of various embodiments.

FIG. 6 illustrates a flip-chip configuration of an example workpiece to which embodiments may be applied. The flip-chip configuration includes a die 202 flip-chip bonded to a package component 200. Reflowable external electrical connectors 204, such as controlled collapse chip connection (C4) bumps, other bumps, or other electrical connectors, mechanically and/or electrically couple the die 202 to the package component 200. The die 202 may be a memory die; a logic die, such as a Central Processing Unit (CPU), a Graphics Processing Unit (GPU), or the like; or any other type of die. The package component 200 may be a package substrate (e.g., an organic substrate), an interposer, a PCB, or the like. The die 202 includes bond structures, such as under bump metal (UBM) structures, post-passivation interconnect (PPI) structures, trace structures, and/or the like, to which respective reflowable external electrical connectors 204 are mechanically and electrically coupled. Additionally, the package component 200 has bond structures to which respective reflowable external electrical connectors 204 are mechanically and electrically coupled. In an embodiment, the reflowable external electrical connectors 204 are solder, such as a lead-free solder. The die 202 may be attached to the package component 200 by, at least in part, reflowing the reflowable external electrical connectors 204 according to reflow processes discussed above and/or in a reflow tool as discussed above.

FIG. 7 is a Fan-Out Wafer Level Package (FOWLP) 302 as an example workpiece to which embodiments may be applied. The package 302 includes a die 304 encapsulated by an encapsulant 306, such as a molding compound, and a redistribution structure 308. The die 304 may be a memory die; a logic die, such as a CPU, a GPU, or the like; or any other type of die. The structure further includes a package component 300, such as a PCB, organic substrate, or the like. Reflowable external electrical connectors 310, such as ball grid array (BGA) balls, bumps, or other electrical connectors, mechanically couple the package 302 to the package component 300 and further electrically couple, in combination with the redistribution structure 308, the die 304 to the package component 300. The redistribution structure 308 includes bond structures, such as UBM structures, PPI structures, trace structures, and/or the like, to which respective reflowable external electrical connectors 310 are mechanically and electrically coupled. Additionally, the package component 300 has bond structures to which respective reflowable external electrical connectors 310 are mechanically and electrically coupled. In an embodiment, the reflowable external electrical connectors 310 are solder, such as a lead-free solder. The package 302 may be attached to the package component 300 by, at least in part, reflowing the reflowable external electrical connectors 310 according to reflow processes discussed above and/or in a reflow tool as discussed above.

FIG. 8 is a Package-On-Package (POP) as an example workpiece to which embodiments may be applied. The structure includes a first package 400 on which a second package 408 is stacked. The first package 400 includes a die 404 flip-chip bonded to a package component 402. Reflowable external electrical connectors 406, such as C4 bumps, other bumps, or other electrical connectors, mechanically and/or electrically couple the die 404 to the package component 402. The die 404 may be a memory die; a logic die, such as a CPU, a GPU, or the like; or any other type of die. The package component 402 may be a package substrate (e.g., an organic substrate), an interposer, a PCB, or the like. The die 404 includes bond structures, such as UBM structures, PPI structures, trace structures, and/or the like, to which respective reflowable external electrical connectors 406 are mechanically and electrically coupled. Additionally, the package component 402 has bond structures to which respective reflowable external electrical connectors 406 are mechanically and electrically coupled. In an embodiment, the reflowable external electrical connectors 406 are solder, such as a lead-free solder. The die 404 may be attached to the package component 402 by, at least in part, reflowing the reflowable external electrical connectors 406 according to reflow processes discussed above and/or in a reflow tool as discussed above.

The second package 408 includes a die 412 adhered to a package component 410, such as by an adhesive on an inactive side of the die 412. Wires 414 electrically couple the active side of the die 412 to the package component 410. The die 412 may be a memory die; a logic die, such as a CPU, a GPU, or the like; or any other type of die. The package component 410 may be a package substrate (e.g., an organic substrate), an interposer, a PCB, or the like. The die 412 includes bond structures to which wires 414 are mechanically and electrically coupled. Additionally, the package component 410 has bond structures to which wires 414 are mechanically and electrically coupled. The die 412 and the wires 414 are encapsulated by an encapsulant 416, such as by a molding compound.

Reflowable external electrical connectors 420, such as BGA balls, bumps, or other electrical connectors, mechanically couple the second package 408 to the first package 400. The package component 402 has bond structures to which respective reflowable external electrical connectors 420 are mechanically and electrically coupled. Similarly, the package component 410 has bond structures to which respective reflowable external electrical connectors 420 are mechanically and electrically coupled. In an embodiment, the reflowable external electrical connectors 420 are solder, such as a lead-free solder. The second package 408 may be attached to the first package 400 by, at least in part, reflowing the reflowable external electrical connectors 420 according to reflow processes discussed above and/or in a reflow tool as discussed above.

An embodiment is a method comprising enclosing a package workpiece in an enclosed environment of a chamber of a reflow tool; causing an oxygen content of the enclosed environment of the chamber to be less than 40 parts per million (ppm); and performing a reflow process in the enclosed environment of the chamber while the oxygen content is less than 40 ppm. The reflow process reflows a reflowable material of the package workpiece.

Another embodiment is a method comprising moving a package workpiece into a chamber of a reflow tool; after the package workpiece is in the chamber, closing a door of the chamber; after closing the door, supplying an inert gas to the chamber to decrease an oxygen content in the chamber; while the oxygen content in the chamber is less than 40 parts per million (ppm), performing a reflow process to reflow a solder-containing material of the package workpiece; and after performing the reflow process, stopping the supply of the inert gas.

A further embodiment is an apparatus comprising a reflow chamber, a door to the reflow chamber, an energy source in the reflow chamber, and gas supply equipment coupled to the chamber. The door is operable to enclose an environment in the reflow chamber. The energy source is operable to increase a temperature in the environment in the reflow chamber. The gas supply equipment is operable to provide a gas to the reflow chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
moving a package workpiece into a chamber of a reflow tool, an exhaust system set at a first pressure removing gas from the chamber during the moving the package workpiece into the chamber;
enclosing the package workpiece in an enclosed environment of the chamber;
causing an oxygen content of the enclosed environment of the chamber to be less than 40 parts per million (ppm), the causing the oxygen content to be less than 40 ppm comprising setting the exhaust system at a second pressure less than the first pressure; and
performing a reflow process in the enclosed environment of the chamber while the oxygen content is less than 40 ppm, the reflow process reflowing a reflowable material of the package workpiece.

2. The method of claim 1, wherein the enclosing the package workpiece comprises closing a door of the chamber to form the enclosed environment of the chamber.

3. The method of claim 1, wherein the causing the oxygen content to be less than 40 ppm comprises supplying an inert gas to the enclosed environment while the exhaust system removes gas from the enclosed environment.

4. The method of claim 3, wherein the inert gas comprises nitrogen.

5. The method of claim 3, wherein the inert gas is supplied at a flow rate of at least 17 $m^3$/min.

6. The method of claim 1 further comprising:
providing the package workpiece on a stage, wherein the moving the package workpiece into the chamber further comprises moving the stage and the package workpiece on the stage into the chamber;
after moving the stage and the package workpiece into the chamber, closing a door of the chamber to enclose the package workpiece in the enclosed environment, wherein the setting the exhaust system at the second pressure is performed after closing the door, the second pressure being less than 5 mm H2O;
after setting the exhaust system at the second pressure, supplying an inert gas to the enclosed environment at a flow rate of at least 17 $m^3$/min, the supplying the inert gas at least in part causing the oxygen content of the enclosed environment to be less than 40 ppm;
after the performing the reflow process, stopping the supplying the inert gas; and
after stopping the supply of the inert gas, opening the door of the chamber.

7. A method comprising:
moving a package workpiece into a chamber of a reflow tool, wherein gas is removed from the chamber by an exhaust system set at a first pressure during the moving the package workpiece into the chamber;
after the package workpiece is in the chamber, closing a door of the chamber;
after closing the door, supplying an inert gas to the chamber and removing gas from the chamber using the exhaust system set at a second pressure to decrease an oxygen content in the chamber, the second pressure being less than the first pressure;
while the oxygen content in the chamber is less than 40 parts per million (ppm), performing a reflow process to reflow a solder-containing material of the package workpiece; and
after performing the reflow process, stopping the supply of the inert gas.

8. The method of claim 7, wherein the inert gas comprises nitrogen.

9. The method of claim 7, wherein the inert gas is supplied at a flow rate of at least 17 $m^3$/min.

10. The method of claim 7, wherein the second pressure is less than 5 mm H2O.

11. The method of claim 7, wherein moving the package workpiece into the chamber comprises receiving the package workpiece on a stage and moving the stage with the package workpiece into the chamber.

12. The method of claim 7 further comprising:
after stopping the supply of the inert gas, opening the door of the chamber; and
after opening the door, removing gas from the chamber using the exhaust system set at a pressure of greater than 15 mm H2O.

13. The method of claim 7, wherein the performing the reflow process comprises using infrared (IR) radiation.

14. A method comprising:
providing a package workpiece on a stage;
moving the stage and the package workpiece into a chamber of a reflow tool;
during the moving the stage and the package workpiece into the chamber, removing a gas from the chamber using an exhaust set at a pressure greater than 5 mm H2O;
after moving the stage and the package workpiece into the chamber, closing a door of the chamber to enclose the package workpiece in an enclosed environment in the chamber;
after closing the door, setting the pressure of the exhaust to be less than 5 mm H2O;
after setting the pressure of the exhaust, supplying an inert gas to the enclosed environment at a flow rate of at least 17 $m^3$/min, the supplying the inert gas at least in part causing an oxygen content of the enclosed environment to be less than 40 parts per million (ppm);
performing a reflow process on the package workpiece in the enclosed environment of the chamber while the oxygen content is less than 40 ppm, the reflow process reflowing a solder-containing material of the package workpiece;
after the performing the reflow process, stopping the supplying the inert gas; and
after stopping the supply of the inert gas, opening the door of the chamber.

15. The method of claim 14, wherein the inert gas includes nitrogen, a forming gas, or a combination thereof.

16. The method of claim 14 further comprising after opening the door of the chamber, setting the pressure of the exhaust to be greater than 15 mm H2O.

17. The method of claim 14 further comprising after opening the door of the chamber, cooling the chamber comprising using a fan.

18. The method of claim 14, wherein during the reflow process, a temperature of the enclosed environment is in a range from 40° C. to 60° C.

* * * * *